United States Patent [19]

Snyder et al.

[11] Patent Number: 4,896,817
[45] Date of Patent: Jan. 30, 1990

[54] FLUX COMPOSITION AND METHOD OF DECREASING TIN CONTENT IN LEAD/TIN SOLDER JOINTS

[75] Inventors: Randy W. Snyder, Vestal; James Spalik, Kirkwood, both of N.Y.

[73] Assignee: International Business Machines Corp., Armonk, N.Y.

[21] Appl. No.: 258,524

[22] Filed: Oct. 17, 1988

[51] Int. Cl.⁴ ............................................ B23K 35/363
[52] U.S. Cl. .................... 228/123; 228/223; 228/207; 148/23; 75/78; 75/93 R
[58] Field of Search .............. 228/223, 224, 123, 207; 148/23-26; 75/78, 93 R

[56] References Cited

U.S. PATENT DOCUMENTS

| | | | |
|---|---|---|---|
| 2,097,560 | 11/1937 | Butcher | 75/78 |
| 2,115,299 | 4/1938 | Butcher | 75/78 |
| 2,235,423 | 3/1941 | Erickson | 75/78 |
| 3,970,239 | 7/1976 | Hill | 148/23 |
| 4,165,244 | 8/1979 | Jacobs | 148/23 |
| 4,274,483 | 6/1981 | Cottone et al. | 165/153 |
| 4,332,343 | 6/1982 | Koopman et al. | 228/223 |
| 4,360,392 | 11/1982 | Roberts | 148/23 |

Primary Examiner—Richard K. Seidel
Assistant Examiner—Samuel M. Heinrich

[57] ABSTRACT

A technique for soldering is provided wherein the solder contains a nominal amount of 4 to 5% tin and the remainder lead. A solder flux is utilized which incorporates a lead compound, such as lead acetate. When the solder and flux is heated, a redox reaction will take place in which the lead ions in the flux will replace the alloyed tin in the solder, thereby reducing the tin content of the solder, whereby the ductility of the solder joint is improved.

14 Claims, 1 Drawing Sheet

TIN DEPLETION OF 5% TIN / 95% LEAD SOLDER

TIN DEPLETION OF CERTAIN SOLDERS

THERMAL CYCLE DATA

FLUX COMPOSITION AND METHOD OF DECREASING TIN CONTENT IN LEAD/TIN SOLDER JOINTS

BACKGROUND OF THE INVENTION

1. Field of the Invention

This invention relates generally to solder joints, and more particularly to a method and composition for improving the strength of lead/tin solder joints without sacrificing wetability.

2. Prior Art

One very popular low melting composition for soldering joints is a lead/tin composition which nominally contains about 95% lead and 5% tin. One particular application for this material is reverse chip bonding of integrated circuit chips to ceramic substrates. The principal reason for the presence of the tin in this composition is to enhance the wetability of the solder with respect to the surface or surfaces to which the solder is being applied. With amounts of tin less than about 4% or 5%, the solder does not effectively wet the surface which in many cases contributes to poor solder joints, the failure mechanism normally being the failure of the solder to bond to the surface because it did not properly wet. However, the presence of tin in the solder composition does have certain drawbacks, the principle of these being that the solder joint is somewhat more brittle than a solder joint of pure lead or very low alloy content lead. Thus, the use of 95/5 lead/tin solder is a trade-off, the tin being present in just enough amount to provide the desired wetability of the underlying surface, but in no greater amount than is necessary since even this small amount does significantly degrade the ductility of the joint. Hence, in this trade-off, in the soldering with lead solders one provides just enough tin to insure proper wetting of the surface but only this minimal amount to minimize the degradation of the quality of the solder joints. One prior art technique for reducing tin that has been proposed is found in U.S. Pat. No. 4,332,343 in which carboxylic acids are introduced into the flux to react with the tin in the solder. This has not proven to be entirely effective. Also, certain other additives to flux compositions for other purposes have been proposed. For example, very small amounts (0.002% to 0.005%) of lead carbonate are added to fluxes to prevent biodegradation during storage are taught by U.S. Pat. No. 4,360,392; and catalysts for causing certain reactions within soldering fluxes are disclosed in U.S. Pat. No. 4,165,244, which catalysts include a wide range of organo-metallic's. U.S. Pat. No. 3,970,239 teaches reacting lead oxide with an acetate compound, which will form a coordinate lead compound.

SUMMARY OF THE INVENTION

According to the present invention a solder composition and technique of soldering is provided wherein the nominal amount of 4% to 5% tin is maintained in the lead/tin solder but during the soldering operation some of the alloyed tin that is contained in the solder is removed. Thus, the solder can be initially placed on the pad and function to wet the pad properly because it has enough tin for wetability, but when the solder joint is formed, most of the tin is removed (i.e. less than 1% remaining), thereby providing a resulting solder joint in which there is a minimal amount of tin with the maximum amount of lead to significantly increase the quality of the solder joint. This is accomplished by incorporating in the flux a lead or other metal compound which during the soldering operation will react with the alloyed tin in the solder to oxidize the elemental tin in the solder and reduce the lead ions in the flux thereby exchanging the lead in the flux for the tin in the solder. This oxidation-reduction reaction effectively removes the alloyed tin, (i.e. down to about less than 1% tin remaining), and replaces it with lead thereby improving the ductility of the solder joint.

DESCRIPTION OF THE PREFERRED EMBODIMENT

Figure 1:
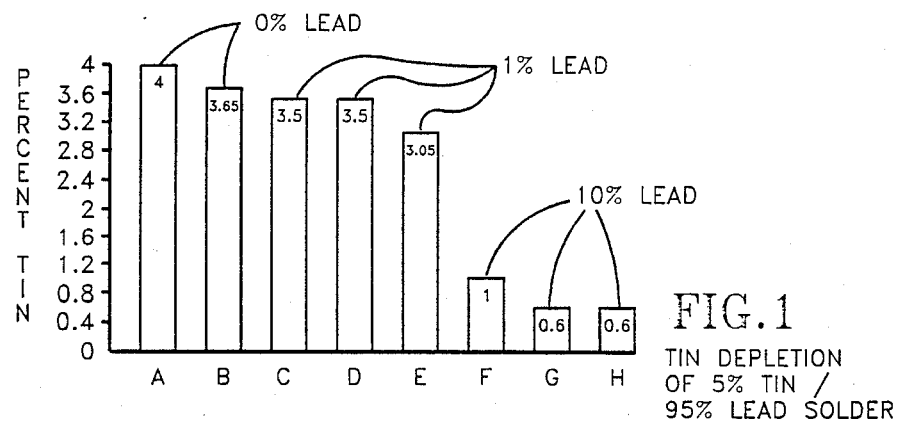
FIG. 1 shows the resulting tin compositions in solder joints of chips onto substrates after soldering with fluxes having differing amounts of lead acetate added thereto.

According to the present invention, a lead or other metal compound is dissolved in a solder flux so that when the flux is applied to a lead/tin solder ball or pad and heated above the liquidous temperature of the solder, the lead or other metal compound will ionize and enter into an oxidation-reduction reaction with the elemental tin in the solder which will result in a removal of the alloyed tin from the solder composition replacing the tin with the lead from the flux. In this oxidation-reduction reaction the elemental tin is oxidized and the lead ions are reduced thus replacing the tin in the solder with lead from the flux. A particularly good compound for incorporation into the flux is lead acetate. When the lead acetate is dissolved in the flux and the flux and solder and are heated above the liquidous temperature of the solder such as happens during a soldering operation, the following reaction takes place: $Pb^{++}(CH_3COO)_2^- + Sn^O + Flux \rightarrow Pb^o + SN^{++}(CH_3COO)_2^-$. The redox reactions are simply $Sn^o \rightarrow Sn^{++} + 2e$; and $Pb^{++} + 2e \rightarrow Pb^o$. This is a straightforward oxidation-reduction reaction in which the lead ions in the flux are being reduced to elemental lead and the elemental tin in the solder is being oxidized to tin ions to form tin acetate. There may be a further reaction with the flux if the flux contains certain organic acids such as abietic acid as many flux's do, with the tin reacting to form tin abietate and the acetate forming acetic acid, which is volatilized. In any event, the central feature is that the compound that is contained within the flux must contain ions that will react with the tin in the solder so as to remove the tin during the soldering operation and replace the tin with the reduced elemental metal from the flux. While metals other than lead could be used, the preferred metal is lead, since lead is the base metal of the solder and hence the introduction of another metal normally would not be warranted, it being desired to replace the tin with the other metal of the situation, one could use any metal which has an electrical potential which is more negative than that of tin and which compound is soluble in this flux. These metals include indium, cadmium, zinc, etc.

Also, other anions can be used. For example, in addition to other organic metal salts, lead chloride, lead carbonate, lead stannate and lead oxide can be used although their solubility in certain flux's is not as great as that of lead acetate.

Also, the amount of this composition contained in the flux can vary and indeed as little as 1% of lead ions by weight, will produce some result although it is desired that there be at least about 2%, lead ions in the flux, and there can be as much as the flux will hold although normally more than about 10% lead ions is not desired since this will promote staining of the substrate which is undesirable. In any event, the amount of lead contained in the flux should be at least equal to the stoichiometric amount of tin which it is desired to remove from the solder composition. In this respect it has been found that any of the tin that is dissolved in lead cannot readily be removed, but rather it is only the insoluble tin that is removed. It is believed that the undissolved tin is what contributes to brittleness and not the dissolved tin. In this area of the Pb/Sn phrase diagram about 0.7% tin is soluble in lead so the tin composition can be reduced from its nominal 5% down to about 0.7% with this technique.

Normally it is desired to merely add the desired lead composition directly to the flux. However, an alternative technique of adding a lead salt to the flux is as follows:

Once the solder balls have been formed on the pads and the tin has performed its function of wetting the surface, the solder balls are then heated in an oxidizing atmosphere to oxidize the outer surface of the solder. This will be predominately lead oxide since the solder is predominately lead (about 95%) with a small amount of tin oxide (no more than about 5% tin). The conventional flux is applied over the oxidized solder balls. During the subsequent soldering operation, the lead oxide is first dissolved into the flux to form lead ions, which lead ions react with the free tin in the solder. The lead is reduced to elemental metal and displaces the tin and the tin is oxidized and goes into the flux as tin ions just as previously described. While this technique is somewhat effective, it does have some limitations in that it is not always possible to control the amount of lead oxide on the surface of the solder balls to get the precise amount of lead oxide into the solder and assure a good joint. However, under controlled circumstances, it is effective and does, in fact, reduce the tin by incorporating the lead compound into the prior solder of the wire after the tin has performed its wetting function.

Various type of solder can be used, the only requirement being that the solder include a component in which the lead compound or composition is soluble. One particularly effective flux is Alpha 102-1500 flux which has a benzol alcohol solvent and is available from Alpha Metals, Inc. Other types of flux's which include isopropyl alcohol may not provide sufficient solubility for certain lead compositions such as lead acetate. However, the type of flux is not critical other than it contain a solvent for the lead composition which is to be used.

FIG. 1 shows the resulting tin composition in six different solder joints utilizing various flux and solder compositions as starting materials. The soldering was performed on standard I/C chips, soldering them to ceramic substrates in using conventional flip-chip soldering techniques. Basically, this soldering technique was as follows: Rosin flux is applied to the chip area of the substrate and the inverted chip is placed on the flux. The assembly is passed through a tube furnace containing a nitrogen atmosphere, with the temperature in the furnace being ramped to approximately 350° C. with the residence time above 300° C. being about 2 minutes. The assembly is then cooled to room temperature. In Sample No. A, a nominal % Sn 95% Pb solder was used, utilizing a single fluxing and single firing operation. The flux contained no lead compounds. The resulting composition was about 4% tin. In example B, a double flux double fire was used; i.e. after the fluxing and soldering operation was performed, an additional amount of flux was applied around the joint, and the joint again heated to above the liquidous temperature. The resulting joint had about 3.65% Sn. In example C, the joint was formed with nominal 95%/5% solder using single fire single flux technique as described above wherein the flux contained about 1% by weight of lead acetate. The result was a joint with about 3.5% tin. In example D, a double flux double firing technique was used with a 95%/5% solder wherein the first flux contained no lead compound and the second flux contained 1% by weight lead acetate. The result was a joint with about 3.5% Sn. Example E is similar to example D, i.e. a double flux double firing technique, but both flux's contained about 1% by weight of lead acetate. Example F is similar to example C except that the flux contained about 10% lead acetate, and the resulting joint had about 1% Sn. Example G was similar to example D except second flux contained about 10% lead acetate and the resulting joint had about 0.6% Sn. Finally, example H is similar to example E except that both the flux's contained about 10% lead acetate. The resulting Sn content was about 0.6%.

Figure 2:
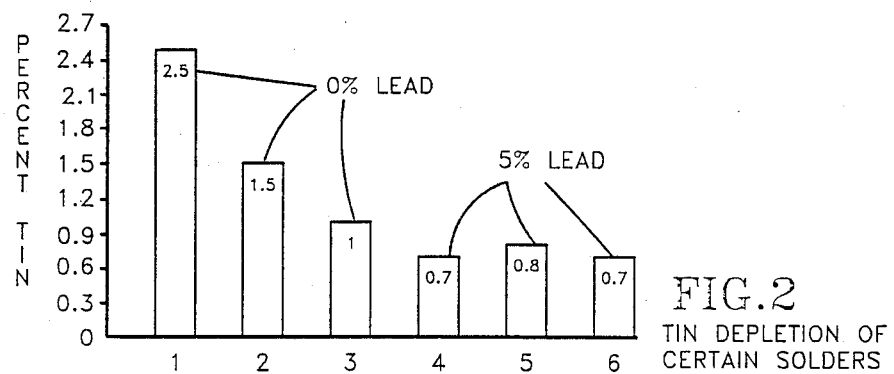
FIG. 2 shows the resulting tin percentage after soldering of the different solder composition and two flux compositions of chips onto substrates.

FIG. 2 shows a set of six sample I/C chips bonded to a ceramic substrate by the flip-chip bonding technique as described above. In these examples, all of the soldering was done with double fluxing and double firing. In examples 1, 2, and 3, the flux contained no lead compounds, and in example 4, 5, and 6, the flux contained 5% lead acetate. The solder of example 1 and 4 contained nominally 5% Sn, the solder of examples 2 and 5 contained nominally 3% Sn and the solder of example 3 and 6 contained nominally 3% Sn originally.

These FIGS. 1 and 2 graphically represents how the incorporation of a lead compound in a flux can significantly reduce the amount of tin in the resulting joint composition.

Figure 3:
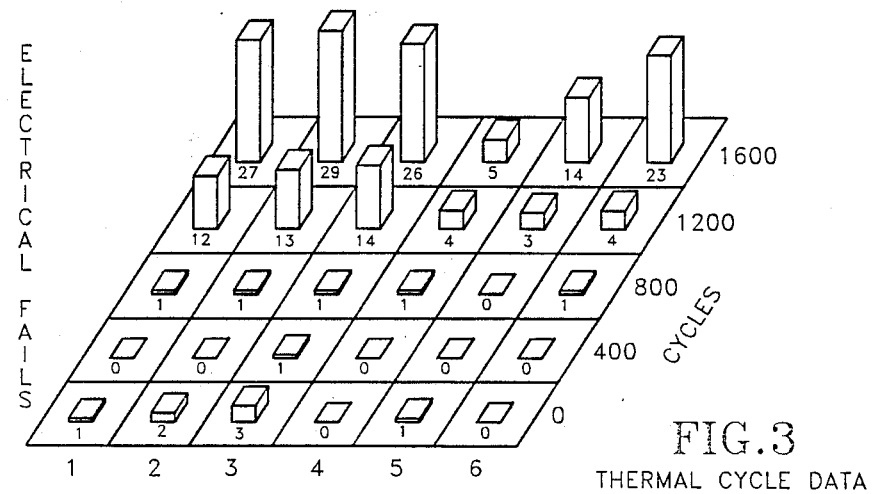
FIG. 3 is a bar graph representation of the number of failures in integrated circuit chips soldered to ceramic substrates of the compositions shown in FIG. 2.

The improvement in the quality of the solder joint is shown graphically in FIG. 3 wherein these same six examples from FIG. 2 have been thermally cycled for various cycles and tested for electrical failures. This test was performed as follows: Shorted chip/ceramic substrate assemblies were thermal cycled between 0 and 100° C. at 3 cycles per hour. The chips were periodically electrically tested for opens. If any solder joint on a chip failed then the whole chip would fail the electrical test. The criterion of the test therefore was the total number of chips to fail electrical testing after thermal cycling. The total number of failed solder joints per chip was not determined.

In all six cases it can be seen that at 800 cycles there are few if any failures although there are slightly more failures in solders 1, 2 and 3 then there are in solder flux's 4, 5, and 6. However, at 1200 cycles in solder No. 1 there were 12 chip failures in the 45 chips; in solder No. 2 there were 13 chip failures in the 45 chips; and in solder No. 3 there were 14 chip failures in the 45 chips. Where the lead compound was used in the flux there were correspondingly only 4, 3 and 4 chip failures in solders 4, 5, and 6. At 1600 cycles in solder 1, 2 and 3 there was a significant number of failures, i.e. 27, 29 and 26 chips as compared to significantly less number of failures in solders 4, 5, and 6 and especially in solder 4 where there was 5% lead acetate used in the flux as well as a high initial tin content in the solder. This is a significant reduction and shows dramatically how there is a significant improvement in solder joint strength by practicing this invention as opposed to conventional solder technology where the tin is allowed to remain in the solder joint.

Although the invention has been described with some degree of particularity, various adaptations and modifications can be made without departing from the scope of the invention as defined in the appended claims.

What is claimed:

1. A process for reducing the amount of tin in a lead/tin solder comprising the steps of:
   providing a flux having a metal compound dissolved in said flux to a degree such as to provide at least a stoichiometric amount of lead in the flux equal to the amount of tin to be removed from the solder; and wherein said metal is more electronegative than tin;
   applying said flux to a given amount of solid solder heating said solder and said flux above the melting point of said solder to cause the metal compound in the flux to react with the free tin and reduce the metal compound to free metal and oxidize the tin to the corresponding tin compound.

2. The invention as defined in claim 1 wherein said metal is lead.

3. The invention as defined in claim 2 wherein the lead compound is a lead salt.

4. The invention as defined in claim 3 wherein said lead salt is selected from chlorides, oxides, carbonates, stannates, and organic salts.

5. The invention as defined in claim 3 wherein the lead salt is lead acetate.

6. The invention as defined in claims 2, 3, 4 or 5 wherein the lead is present in an amount greater than about 2% by weight.

7. The invention as defined in claims 2, 3, 4 or 5 wherein the lead is present in an amount between about 2% and about 10% by weight.

8. In a flux composition for fluxing solder connections of a lead/tin solder, the improvement comprising, an effective amount of a metal compound dissolved in said flux to remove undissolved tin in said solder, said metal being more electronegative than tin, said metal being present in a stoichiometric amount sufficient to remove the undissolved tin in the solder connection.

9. The invention as defined in claim 8 wherein said metal is lead.

10. The invention as defined in claim 9 wherein the lead compound is a lead salt.

11. The invention as defined in claim 10 wherein said lead salt is selected from chlorides, oxides, carbonates, stanates, and organic salts.

12. The invention as defined in claim 10 wherein the lead salt is lead acetate.

13. The invention as defined in claims, 9, 10, 11 or 12 wherein the lead is present in an amount greater than about 2% by weight.

14. The invention as defined in claims 9, 10, 11 or 12 wherein the lead is present in an amount between about 2% and about 10% by weight.

* * * * *